United States Patent [19]
Segars

[11] Patent Number: 5,636,227
[45] Date of Patent: Jun. 3, 1997

[54] INTEGRATED CIRCUIT TEST MECHANSIM AND METHOD

[75] Inventor: Simon A. Segars, Cambridge, Great Britain

[73] Assignee: Advanced Risc Machines Limited, Cambridge, United Kingdom

[21] Appl. No.: 273,097

[22] Filed: Jul. 8, 1994

[51] Int. Cl.$^6$ ................................................. G11C 29/00
[52] U.S. Cl. ........................................ 371/22.3; 371/22.6
[58] Field of Search ................................... 371/22.3, 22.5, 371/27, 22.1; 324/73.1; 395/183.06

[56] References Cited

U.S. PATENT DOCUMENTS

| | | | |
|---|---|---|---|
| 5,109,190 | 4/1992 | Sakashita et al. | 371/22.3 |
| 5,150,044 | 9/1992 | Hahizumei | 371/22.3 |
| 5,161,160 | 11/1992 | Yaguchi et al. | 371/22.3 |
| 5,349,587 | 9/1994 | Nadeau-Dastie et al. | 371/22.3 |
| 5,377,198 | 12/1994 | Simpson et al. | 371/22.3 |
| 5,390,191 | 2/1995 | Shiono et al. | 371/22.3 |
| 5,416,409 | 5/1995 | Hunter | 371/22.3 |
| 5,448,525 | 9/1995 | Sturges | 371/22.3 |
| 5,471,481 | 11/1995 | Okumoto et al. | 371/22.3 |
| 5,513,189 | 4/1996 | Savage | 371/22.3 |

OTHER PUBLICATIONS

IEEE, IEEE Standard Test Access Port and Boundary–Scan Architecture, IEEE Standard 1149.1–1990, May 21, 1990, p. i–A–13.

*Primary Examiner*—Robert W. Bearsoliel, Jr.
*Assistant Examiner*—Trinh L. Tu
*Attorney, Agent, or Firm*—Albert C. Smith

[57] ABSTRACT

An integrated circuit test mechanism based upon the JTAG standard utilises serial scan chains for applying signals to and capturing signals from predetermined nodes within an integrated circuit (2). Multiple independent scan chains (12, 14, 16) are provided for different circuit units (4, 6, 8, 10) within the integrated circuit, i.e. individual scan chains (12, 14) for circuit elements such as a central processing core (4) or a cache memory (8). The scan chain controller (18) is responsive to a scan chain selecting instruction (Scan-N) received at its serial input (20) to capture a scan chain specifying value at the serial input. The scan chain specifying value is then used to control the position of a scan chain multiplexer (28) that selects one of the multiple scan chains to which subsequent instructions received at the serial input are applied.

6 Claims, 3 Drawing Sheets

INTEGRATED CIRCUIT TEST MECHANSIM AND METHOD

BACKGROUND OF THE INVENTION

1. Field of the Invention

This invention relates to integrated circuit testing. More particularly, this invention relates to integrated circuit testing using serial scan chains for applying signals to and capturing signals from predetermined nodes within an integrated circuit.

2. Description of the Prior Art

Integrated circuit testing using serial scan chains is known from the JTAG system that is the subject of IEEE Standard 1149.1-1990. In accordance with this Standard, an entire integrated circuit is treated as a whole and tested together. With the increasing complexity of integrated circuits, this has the result that the total number of nodes at which it is desired to sample and apply signal values increases making the serial scan chains longer. Lengthening of the serial scan chains has the result that a greater time is needed to shift in the data to fill the scan chain in order to apply signals to a particular set of nodes, which may be positioned in the middle or towards the end of the scan chain. Similarly, a greater time is needed to shift out particular captured data.

SUMMARY OF THE INVENTION

It is an object of the invention to address the problem of the increase in time needed to transfer data into and out of serial scan chains.

Viewed from one aspect, this invention provides an integrated circuit comprising:

(i) a plurality of circuit units for performing given functions within said integrated circuit;

(ii) a plurality of serial test scan chains each coupled to a different one of said circuit units;

(iii) a scan chain controller having a serial input for receiving signals from outside of said integrated circuit, said scan chain controller being responsive to a scan chain selecting instruction received at said serial input to capture a scan chain specifying value received at said serial input and to use said scan chain specifying value to select a serial test scan chain from among said plurality of serial test scan chains upon which further instructions received at said serial input are to be effected.

The invention both recognises the above mentioned problem and provides a solution to this problem by providing a number of different scan chains on a single integrated circuit. The manner in which this is achieved by adding a new scan chain selecting instruction to the scan testing instruction set enables all the existing instructions to still be supported and so maintains compliance with the JTAG standard. Accordingly, once a scan chain has been selected with the new scan chain selecting instruction, the subsequent instructions applied are effected upon the selected scan chain as if it were the only scan chain that exists within the integrated circuit.

An efficient mechanism for implementing this selection of an active scan chain upon which subsequent instructions are to act is to provide a scan chain multiplexer For connecting one of said plurality of serial scan chains to said serial input in dependence upon said scan chain specifying value.

In order that the scan chain specifying value can be serially captured by the integrated circuit and subsequently used to select the active scan chain, it is preferred that said scan chain controller comprises an instruction decoder for decoding instructions received at said serial input and a scan chain register into which said scan chain specifying value is loaded when a scan chain specifying instruction is decoded by said instruction decoder.

In order to deal with instruction words and data words that may be of different lengths and yet require serial clocking into the integrated circuit it is desirable that the integrated circuit includes a state machine moved between states in dependence upon a mode signal applied to a mode input of said scan chain controller, said state machine controlling an input multiplexer For switching signals received at said serial input between being processed as instruction signals or data signals.

In the case of existing JTAG instructions, these instructions are acted upon as soon as they have been loaded. In the case of the new scan chain selecting instruction, this instruction is loaded but it is not until after the scan chain specifying value has been loaded that the instruction is effected. In order to provide this function it is preferred that said state machine triggers said scan chain multiplexer to respond to a new received scan chain selecting value.

It will be appreciated that the circuit units within the integrated circuit that may be tested with such serial scan chains can take many different forms. However, in the case of more complicated integrated circuits in which the invention finds particular utility it would be usual that said plurality of circuit units includes at least one of:

a central processing core;

a cache memory;

an arithmetic logic unit;

a multiplier;

a coprocessing unit;

a memory management unit;

a contents addressable memory;

a random access memory;

a read only memory; and an in-circuit emulation unit.

Viewed from another aspect this invention provides a method of testing an integrated circuit having a plurality of circuit units for performing given functions within said integrated circuit and a plurality of serial test scan chains each coupled to a different one of said circuit units, said method comprising the steps of:

(i) receiving at a serial input of a scan chain controller signals from outside of said integrated circuit, (ii) in response to a scan chain selecting instruction received at said serial input, capturing a scan chain specifying value received at said serial input; and (iii) using said scan chain specifying value to select a serial test scan chain from among said plurality of serial test scan chains upon which further instructions received at said serial input are to be effected.

The above, and other objects, features and advantages of this invention will be apparent from the following detailed description of illustrative embodiments, which is to be read in connection with the accompanying drawings.

DESCRIPTION OF THE PREFERRED EMBODIMENTS

Figure 1:
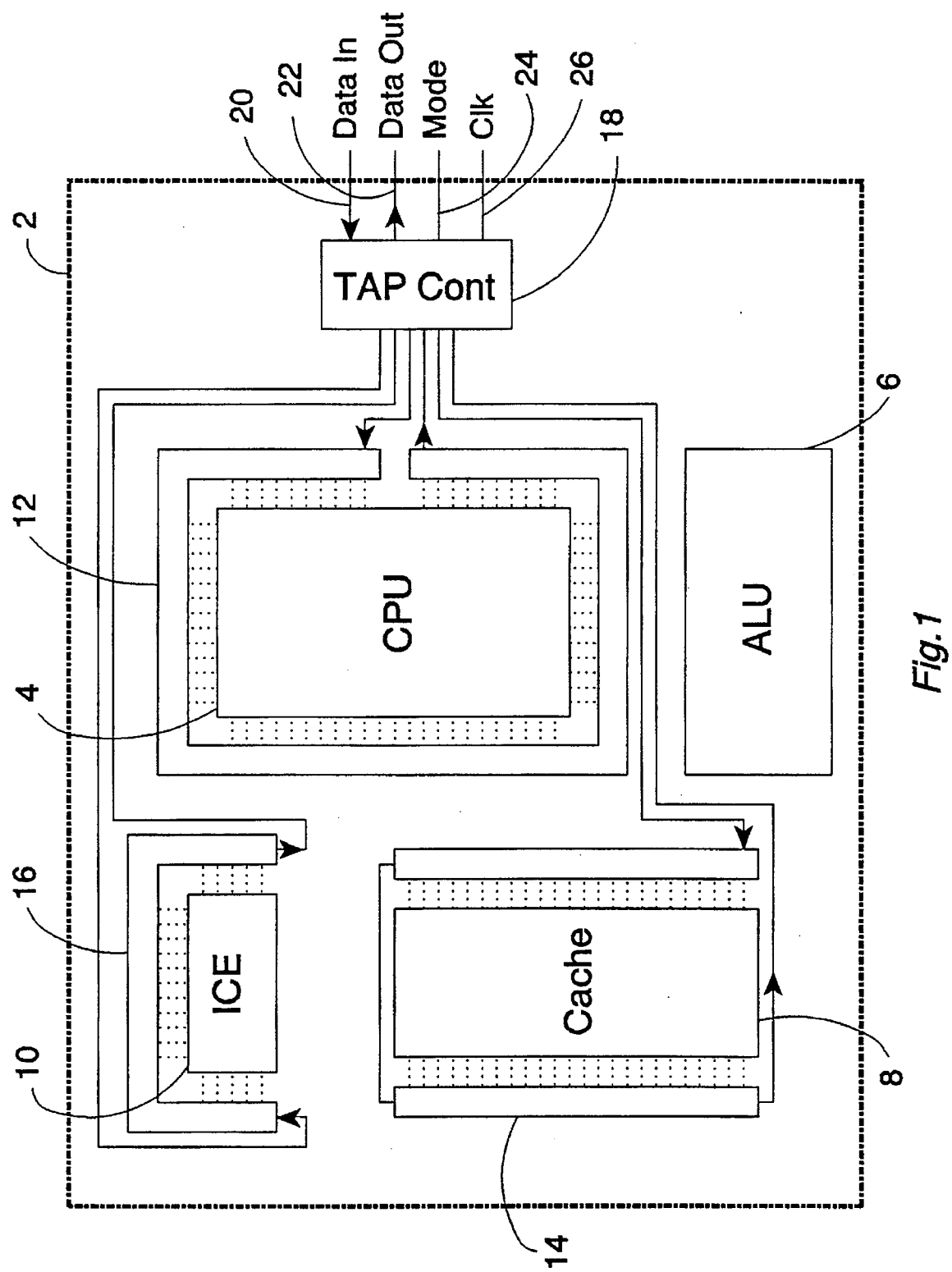
FIG. 1 schematically illustrates an integrated circuit having a plurality of circuit units.

FIG. 1 illustrates an integrated circuit 2 having a plurality of circuit units. These circuit units include a central processing core 4, an arithmetic logic unit 6, a cache memory 8 and an in-circuit emulation unit 10. The central processing core 4, the cache memory 8 and the in circuit-emulation unit 10 are each surrounded by respective serial scan chains 12, 14, 16. Each of the these serial scan chains 12, 14, 16 is connected to a test access port (TAP) controller 18.

The TAP controller 18 is connected to pins on the outside of the package of the integrated circuit 2. In accordance with the JTAG standard, the TAP controller has five such connection pins. As illustrated in FIG. 1, these connection pins comprise a serial data input 20, a serial data output 22, a mode selecting input 24 and a clock signal input 26, which clocks the various elements of the test system. A TAP controller reset pin is also provided, but is not illustrated in this case. The functions performed by the TAP controller 18 include receiving serial instructions via the data input 20, interpreting those instructions, receiving serial data to be applied to the scan chain via the data input 20, outputting serial data captured from the scan chains via the data output 22 and entry to and exit from the test mode.

The TAP controller 18 illustrated in FIG. 1 has the additional function of controlling the selection of one of the serial scan chains 12, 14, 16 as being active. The active serial scan chain selected by the TAP controller 18 is the one upon which instructions subsequently applied to the TAP controller 18 are effected until a different serial scan chain is selected.

Figure 2:
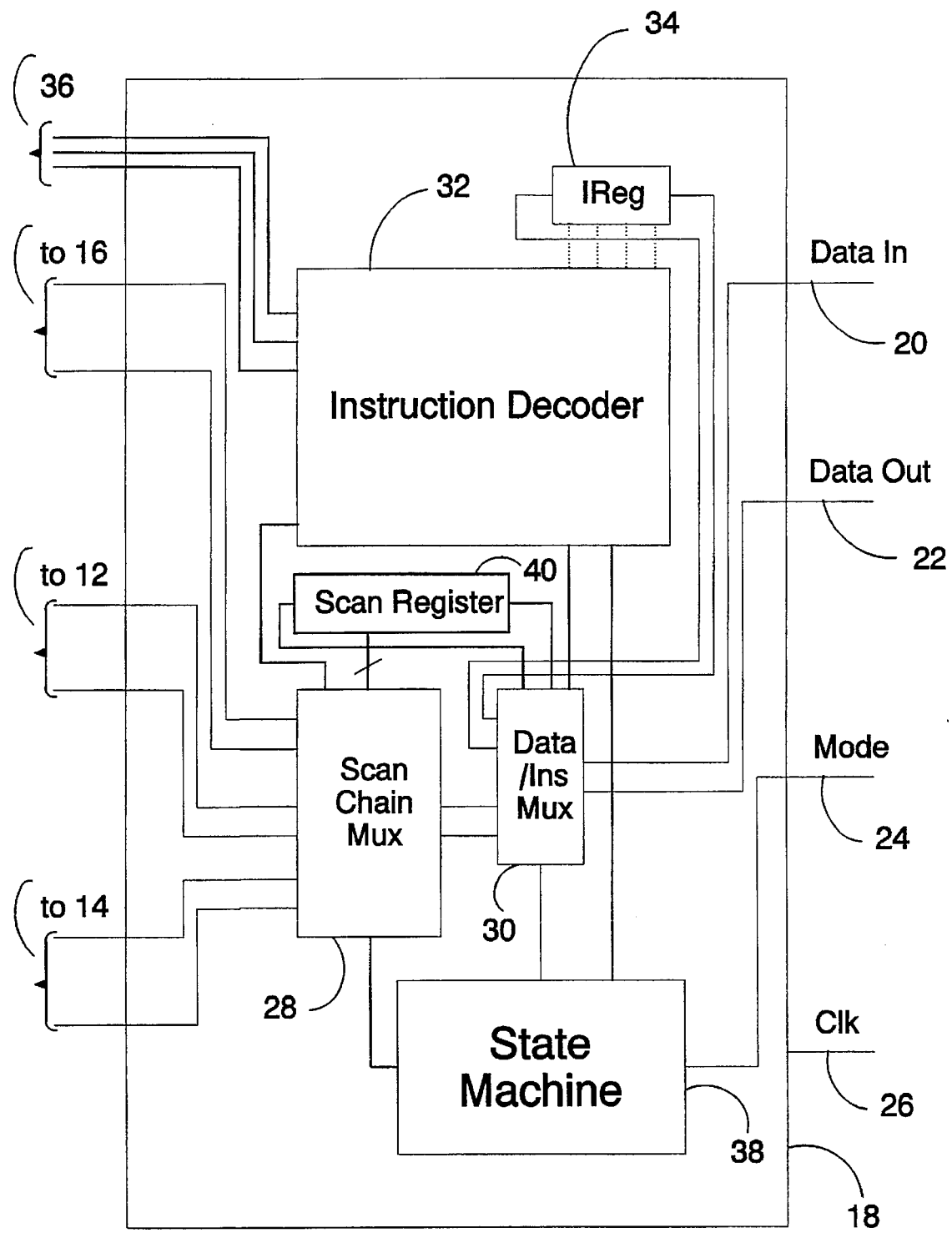
FIG. 2 illustrates a controller for serial scan chain testing.

FIG. 2 illustrates the TAP controller 18 in more detail. The TAP controller 18 includes a scan chain multiplexer 28 that selects between the serial scan chains 12, 14, 16 to be coupled between the data input 20 and the data output 22. An input multiplexer 30 serves to switch signals received at the data input 20 to be processed either as instructions to be decoded by an instruction decoder 32 or as data to be output onto one of the serial scan chains 12, 14, 16.

Instruction data is directed by the input multiplexer 30 to an instruction register 34 into which it is serially clocked. The instructions ape four bits in length. When a complete instruction has been loaded, the instruction decoder 32 interprets the instruction and generates appropriate control signals for use within the TAP controller 18 and for output to elements of the serial scan chain circuitry outside of the TAP controller 18 via control lines 36.

The manner in which the TAP controller 18 treats received signals is primarily controlled by a state machine 38. The state machine is moved between states by the value of a signal applied to the mode input 24. Depending upon the current state in which the state machine 38 is placed, received signals ate treated as instructions or data, serially clocked in or out for the appropriate number of cycles, of captured signals triggered to be interpreted or applied. For example, the state machine 38 controls the switching of the input multiplexer 30 to direct data signals to the scan chain multiplexer 28, instruction signals to the instruction register 34 and in combination with the instruction decoder 30, scan chain specifying signals to a scan register 40. The state machine 38 also serves to indicate to the instruction decoder 32 when a complete instruction word has been loaded into the instruction register 34 and should be decoded, and indicates to the scan chain multiplexer 28 when a complete scan chain specifying value has been loaded into the scan register 40 and is ready to be used.

The scan chain selecting instruction supported by the TAP controller 18 is designated "Scan-N". This has been allocated the four bit value in the instruction space of "0010". The state machine 38 is moved into a capture instruction mode (Shift-IR) and the Scan-N instruction loaded into the instruction register 34. The instruction decoder 32 then decodes this instruction. The state machine 38 is then moved into a state in which signals received at the data input 20 are treated as data (Shift-DR). A combination of the signal applied by the state machine 38 to the input multiplexer 30 and a signal supplied by the instruction decoder 32 upon recognition of a Scan-N instruction serve to switch the input multiplexer 30 to direct received signals to the scan register 40. A Four bit scan chain selecting value is then clocked into the scan register 40. The state machine 38 is then moved through a state indicating that the data capture has been completed and generates a signal that is supplied to the scan chain multiplexer 28 to cause it to use the value within the scan register 40 to select one of the scan chains 12, 14, 16 for use.

Figure 3:
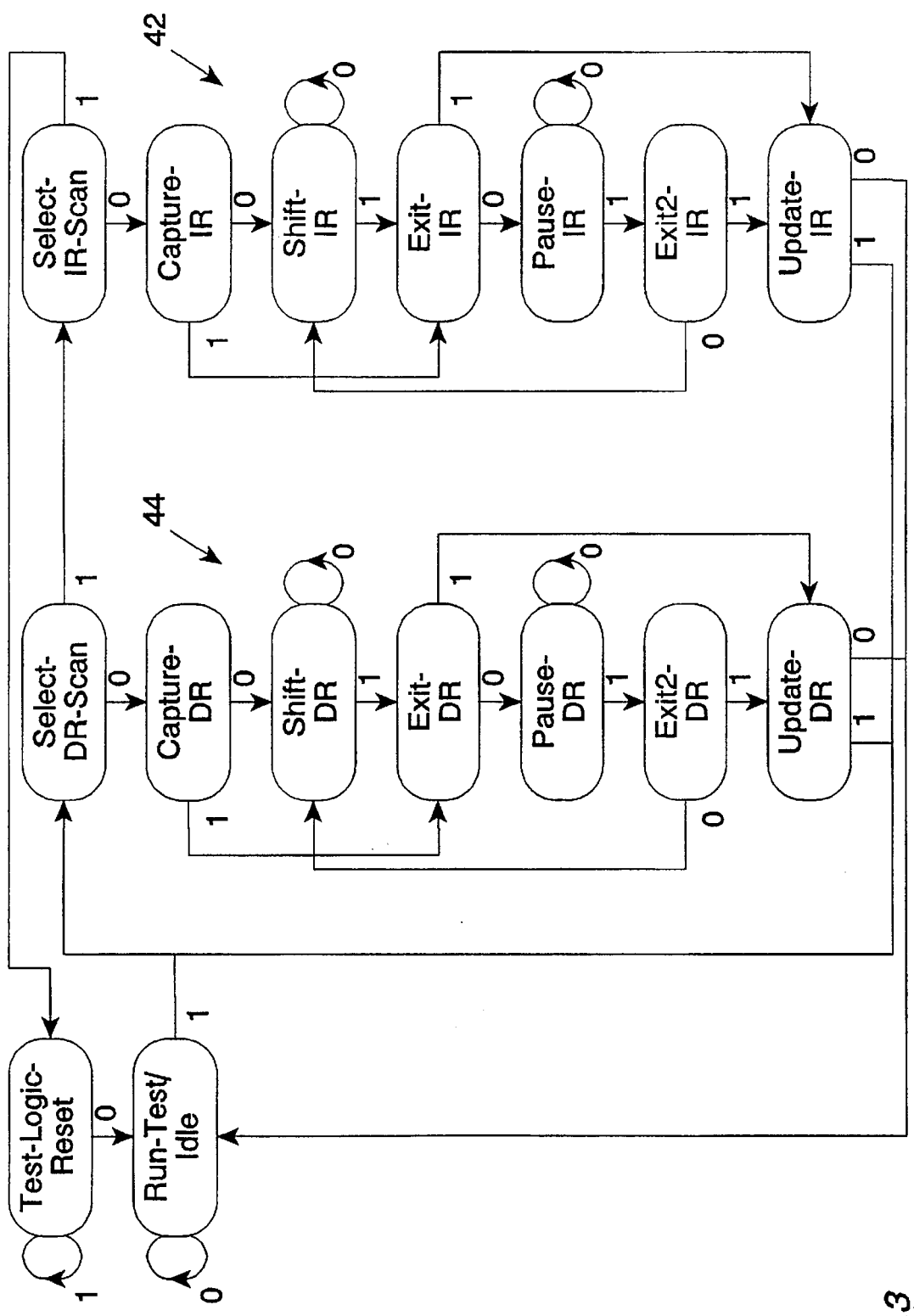
FIG. 3 illustrates a state diagram (based upon IEEE Standard 1149.1-1990) for modes of the controller illustrated in FIG. 2.

FIG. 3 illustrates the states through which the state machine 38 may be passed in accordance with the JTAG standard. Broadly speaking, the states can be considered as having an instruction capturing and interpretation section 42 and a data capturing and interpretation section 44. The manner in which the scan chain selecting instruction Scan-N is handled relative to this state diagram can be described with reference to Table 1.

TABLE 1

| Action/State | Mode Bit Required | Data In Bits Received |
| --- | --- | --- |
| Start at Test-Logic-Reset State | N/A | N/A |
| Move to Capture-IR State | 0110 | **** |
| Cycle around Shift-IR State to receive Scan-N Instruction | 0000 | 0010 |
| Move to Update-IR State; Activate Instruction Decoder | 1011 | **** |
| Move to Capture-DR State; Switch Data/Ins Mux | 10 | ** |
| Cycle around Shift-DR State to receive Scan Chain Specifying Value (e.g. for Scan Chain No. 2) | 0000 | 0010 |
| Move to Update-DR State; Switch Scan Chain Mux | 1011 | **** |
| Return to Run-Test/Idle State | 0 | * |

The state machine 38 starts in the Test-Logic-Reset State, it being unimportant what mode bits or received data bits have proceeded that state. The state machine 38 is then moved through the state diagram illustrated in FIG. 3 to the Capture-IR State. The mode bits sequence required to achieve this is "0110". During this move to the Capture-IR State, it is unimportant what bits are present on the data input 20. The state machine then cycles four times through the Shift-IR State to receive the Scan-N Instruction. The mode bits required to achieve the are "0000"and the bits that will be captured at the data input 20 to specify the Scan-N instruction will be "0010", as previously mentioned. After the Scan-N instruction has been captured and stored within the instruction register 34, the State machine 38 moves to the Update-IR State by receipt of mode bits "1011". As the state machine passes through the Update-IR State it generates a signal that is supplied to the instruction decoder 32 and triggers this to decode the instruction stored within the instruction register 34.

The state machine 38 is then moved to the Capture-DR State by received mode bits "10". A signal generated by the state machine 58 in combination with a signal generated by the instruction decoder 32 upon decoding the Scan-N Instruction serves to switch the input multiplexer B5 30 to connect the scan register 40 to the data input 20. The state machine 38 then cycles for four clock periods about the Shift-DR State by application of modes bits "0000". Duping this period, the Scan Chain Specifying Value is loaded into the scan register 40. In the example illustrated in Table 1, the value specifying scan chain number "2" is loaded into the scan register 40, i.e. the bits "0010"are received. The state machine 38 then moves to the Update-DR State through application of mode bits "1011". When passing through the Update-DR State, the state machine 38 triggers the scan chain multiplexer 28 to read the value within the scan register 40 and select the appropriate serial scan chain 12, 14, 16 to which subsequent test instructions are to be applied. Finally, the state machine 38 return to the Run-Test/Idle State by application of mode bit "0".

Subsequently received instructions and data will now be applied to scan chain number "2".

It will be appreciated that the scan register 40 could have any length. A longer scan chain register 40 allows a greater potential number of independent scan chains relating to circuit units to be supported by the test system. It will also be appreciated that the bit pattern chosen fop the Scan-N instruction could take any form free within the instruction space and can be of any length with a suitable length instruction register 34.

Although illustrative embodiments of the invention have been described in detail herein with reference to the accompanying drawings, it is understood that the invention is not limited to those precise embodiments, and that various changes and modifications can be effected therein by one skilled in the aft without departing from the scope and spirit of the invention as defined by the appended claims.

I claim:

1. An integrated circuit comprising:

(i) a plurality of discrete circuit units for performing given functions within said integrated circuit;

(ii) a plurality of serial test scan chains each coupled to a different one of said discrete circuit units;

(iii) a scan chain controller having a serial input for receiving signals from outside of said integrated circuit, said scan chain controller comprising an instruction decoder for decoding a scan chain selecting instruction received at said serial input, and a scan chain register for storing a scan chain specifying value, the scan chain controller being responsive to the decoding of said scan chain selecting instruction by said instruction decoder to cause said scan chain specifying value received at said serial input to be loaded into said scan chain register and to use said scan chain specifying value to control a scan chain multiplexer to connect one of said plurality of serial scan chains to said serial input and upon which further instructions different from said scan chain selecting instruction received at said serial input are to be effected until another scan chain selecting instruction is decoded by said instruction decoder and a corresponding scan chain specifying value loaded into said scan chain register.

2. An integrated circuit as claimed in claim 1, comprising a state machine moved between states in dependence upon a mode signal applied to a mode input of said scan chain controller, said state machine controlling an input multiplexer for switching signals received at said serial input between being processed as instruction signals or data signals.

3. An integrated circuit as claimed in claim 2 wherein said state machine triggers said scan chain multiplexer to respond to a new received scan chain specifying value.

4. An integrated circuit as claimed in claim 1, wherein said plurality of discrete circuit units includes at least one of:

a central processing core;

a cache memory;

an arithmetic logic unit;

a multiplier;

a coprocessing unit;

a memory management unit;

a contents addressable memory;

a random access memory;

a read only memory; and an in-circuit emulation unit.

5. An integrated circuit as claimed in claim 1, wherein said instruction decoder decodes said further instructions received at said serial input.

6. A method of testing an integrated circuit having a plurality of discrete circuit units for performing given functions within said integrated circuit and a plurality of serial test scan chains each coupled to a different one of said discrete circuit units and including a scan chain controller having an instruction decoder, said method comprising the steps of:

(i) receiving at a serial input of said scan chain controller signals from outside of said integrated circuit, (ii) in response to a scan chain selecting instruction received at said serial input being decoded by said instruction decoder within said scan chain controller, loading a scan chain specifying value received at said serial input into a scan chain register; and (iii) using said scan chain specifying value to select a serial test scan chain from among said plurality of serial test scan chains upon which further instructions different from said scan chain selecting instruction received at said serial input are to be effected until another scan chain selecting instruction is decoded by said instruction decoder and a corresponding scan chain specifying value is loaded into said chain register.

* * * * *